United States Patent
Kaluzhny

(10) Patent No.: US 7,297,926 B2
(45) Date of Patent: Nov. 20, 2007

(54) COMPOUND EYE IMAGE SENSOR DESIGN

(75) Inventor: Mikhail Kaluzhny, Newton, MA (US)

(73) Assignee: EM4, Inc., Bedford, MA (US)

( * ) Notice: Subject to any disclaimer, the term of this patent is extended or adjusted under 35 U.S.C. 154(b) by 159 days.

(21) Appl. No.: 11/207,016

(22) Filed: Aug. 18, 2005

(65) Prior Publication Data

US 2007/0040166 A1    Feb. 22, 2007

(51) Int. Cl.
  *H01L 27/00* (2006.01)
  *H01J 40/14* (2006.01)
(52) U.S. Cl. .............................. 250/214.1; 250/208.1; 257/40
(58) Field of Classification Search ............. 250/208.1, 250/214.1, 216; 257/40, 290, 291, 432, 435; 348/360
  See application file for complete search history.

(56) References Cited

U.S. PATENT DOCUMENTS

| | | | |
|---|---|---|---|
| 5,105,238 A | 4/1992 | Nikaido et al. | |
| 5,350,915 A | 9/1994 | Ishihara et al. | |
| 5,703,355 A | 12/1997 | Kawamoto | |
| 6,150,668 A | 11/2000 | Bao et al. | |
| 6,621,098 B1 | 9/2003 | Jackson et al. | |
| 6,740,900 B2 | 5/2004 | Hirai | |
| 2007/0090275 A1* | 4/2007 | Toyoda et al. | 250/208.1 |

OTHER PUBLICATIONS

Dannberg et al., "Polymer UV-molding for micro-optical systems and O/E-integration," *Proc. SPIE 4179*, p. 137, SPI, 2000.

Dimitrakopoulos et al., "Organic thin-film transistors: A review of recent advances," *IBM Journal of Research and Development*, vol., 45, No. 1, 2001.

Forrest et al., "The dawn of organic electronics," *IEEE Spectrum*, vol. 37, No. 8, Aug. 2000.

Goho, "Plastic Chips: New materials boost organic electronics," *Science News Online*, vol. 164, No. 9, Aug. 30, 2003.

Knipp, "Organic Electronics and Nano Photonics for Applications in Information Technology," *Electrical Engineering and Computer Science Seminar*, Apr. 22, 2004.

Krishasamy et al., "High precision target tracking with compound-eye image sensor." *CCEC 2004—CCGEI 2004*, Niagara Falls, May 2004.

Land, "The optics of animal eyes," *Contemporary Physics 29*, pp. 435-455, Sep.-Oct. 1998.

Martin et al., "Obstacle avoidance and speed control in a mobile vehicle equipped with a compound eye," *Intelligent Vehicle, I.* Masaki (editor), pp. 381-386, 1994.

Naoki, "Distruptive Technologies: Opportunities for Organic Chemicals in Information Technology," *DIC Technical Review*, No. 9, pp. 53-61, 2003.

(Continued)

*Primary Examiner*—Kevin Pyo
(74) *Attorney, Agent, or Firm*—Wilmer Cutler Pickering Hale and Dorr LLP

(57) ABSTRACT

A flexible image sensor having an array of lenses disposed on one surface of a substrate flexible optical polymeric substrate, and an array of organic integrated circuit photodetectors on a second surface of the substrate, each lens in the lens array being in optical correspondence with a photodetector in the second array. The lens array and the photodetector array are manufactured using similar, low-temperature methods, preferably utilizing the same toolset.

23 Claims, 5 Drawing Sheets

OTHER PUBLICATIONS

Ong, "Semiconductor ink advances flexible display," *Laser Focus World*, Jun. 2004, pp. 85-88.

Organic Sheet-Image Scanner, *IEEE International Electron Devices Meeting*, 2004.

Sanders et al., "Design and analysis of apposition compound eye optical sensor," *Opt. Eng. 34*, pp. 222-235, Jan. 1995.

Shaw et al., "Organic electronics: Introduction," *IBM Journal of Research and Development*,—vol. 45, No. 1, 2001.

Singer, "Organic Devices on Flexible Substrates Advance," *Semiconductor International*, Nov. 1, 2004.

Snyder, "Acuity of compound eye: Physical Limitations and design," *Journal of Comparative Physiology A 116*, pp. 161-182, 1977.

Someya et al., "A Large-Area, Flexible, and Lightweight Sheet Image Scanner," *2004 IEEE International Electron Device Meeting*, Dec. 2004.

Tanida et al., "Color imaging with an integrated compound imaging system," *Optic Express*, vol. 11, N 18 pp. 2109-2117.

Tanner et al., "The Patent Literature of Nobel Laureate Dennis Gabor," Notes Rec. R. Soc. Lond. 51 (1), 105-120 (1997).

Duparré, et al., "Artificial Compound Eyes - Different Concepts and Their Application to Ultra Flat Image Acquisition Sensors," Fraunhofer-Institut fur Angewandte Optik und Feinmechanik, Germany, Proceedings of SPIE, vol. 5346, pp. 89-100, MOEMS and Miniaturized Systems IV, Ayman El-Fatatry, Editor, Jan. 2004.

Linos, Microlens Arrays, SUSS MicroOptics, pp. 36-41, Feb. 2005.

Peach, "Organic Transistors," EE 341 Presentation, Apr. 2006.

Duparré, et al., "Ultra-Thin Camera Based on Artificial Apposition Compound Eyes," http://www.suss-microoptics.com/downloads/Publications/MOC-04 Duparre.pdf, Proc. of 10th Microopt. Conf., W. Karthe, G. D. Khoe, and Y. Kokubun, eds., ISBN: 3-8274-1603-5, p. E-2, Elsevier, 2004.

\* cited by examiner

COMPOUND EYE IMAGE SENSOR DESIGN

BACKGROUND

Human engineered imaging optical systems are typically laid out like a 'camera eye' or vertebrate eye: a single imaging lens and a focal plane where a fairly high-resolution image is formed. The camera eye demands a fairly large volume for the incoming radiation to come to focus in the focal plane. The behavior and optics of the camera lens is well understood today. In some applications the resolution and the sensitivity is balanced against other advantages such as device mechanical flexibility, larger depth of focus, and larger field of view. Recent improvements in low cost image sensors allow digital cameras to be made smaller and designed more flexibly.

Another design is based on concepts of a compound eye, as found in many insects. A compound eye sensor has a large number of small, independent facets with sub-millimeter diameter, each combined with a low cost image sensor. Compound eye sensors can be divided into apposition and superposition compound eyes. In apposition compound eyes, each facet, or lens, directs light onto a single, corresponding light-detecting element. In superposition compound eyes, multiple facets or lenses direct light onto a particular light-detecting element. Both eye types can use refractive or reflective mechanisms for forming images.

Existing approaches for constructing compound eyes can cause misalignment errors of the optical components (i.e., the lenses) with respect to the electronic components (i.e., the image sensors). Other problems, such as aberration and resolution degradation arise from the planar geometry of existing compound eyes.

SUMMARY

The compound eye design in the described embodiment mimics the compound eyes found in nature, where optical surfaces and receptors are situated on curved surfaces. This contrasts with most existing artificial compound eyes, which have optical surfaces and receptors in a planar geometry that leads to increased lens aberration, optical design and manufacturing complexity, and performance degradation.

In general, in one aspect, the invention features an image sensor having a flexible substrate with an array of lenses disposed on one surface of the substrate, and an array of organic integrated circuit photodetectors on the other side of the substrate, such that each lens of the lens array is aligned with a photodetector element in the photodetector array. Other embodiments include one or more of the following features. The array of lenses can be formed by etching the substrate. The array can be deposited by a wafer-level organic integrated circuit technology and can involve a continuous roll process. The same tool set can be used to manufacture both the lens array and the photodetector array, with the lens array and the photodetector array aligned to an accuracy of at least three microns. The photodetector array can be manufactured using low temperature processes, including processes that operate at temperatures of less than about 120° C., such as solution printing. The substrate can be made of a UV-curable polymer, and can be planar or curved, having, for example, an approximately ellipsoidal shape. The lens pitch and lens focal length can be constant, or can vary across the lens array, and can be customized to the geometry of the substrate.

In general, in another aspect, the invention features a plurality of lenses disposed in an array on a surface of a flexible substrate, the lenses being formed by etching the substrate. Other embodiments include one or more of the following features. The lenses can be spaced uniformly or non-uniformly, and can have focal lengths that vary from one part of the array to another according to the geometry of the substrate. The substrate can be made of a UV-curable polymer.

In general, in still another aspect, the invention features a method of fabricating an image sensor involving: (1) depositing an array of photodetectors on one surface of a flexible substrate, the photodetectors being deposited using wafer level organic integrated circuit technology; and (2) forming an array of lenses on the opposite surface of the substrate. Other embodiments include one or more of the following features. The lens array can be deposited using a continuous roll type manufacturing process. The photodetector array can be deposited using a solution printing process.

DETAILED DESCRIPTION

Image sensors generally have an optical component and an electronic component. In an image sensor based on an artificial compound eye, the optical component includes an array of lenses, and the electronic component includes an array of detectors, each of which is aligned with one of the lenses. In typical existing designs, the lens array is placed on one surface of a rigid, light-transmitting substrate, while the array of detectors is placed on the opposite surface of the substrate.

Figure 1:
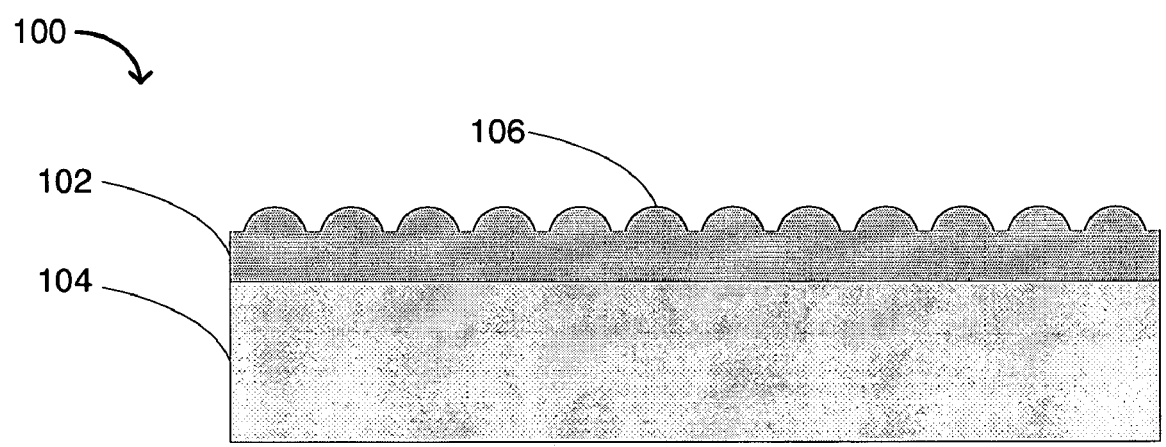
FIG. 1 is an illustration of a lens array deposited on the surface of a rigid substrate.

A lens array for existing compound eye sensors is commonly fabricated by lithography in a UV curable polymer deposited on a glass substrate. FIG. 1 is an illustration 100 of lens array 102, deposited on the surface of rigid substrate 104. Each individual lens 106 is formed from a multi-step process involving master mold generation and subsequent UV replication.

In the described embodiments a sensor combines a flexible lens array etched directly onto one surface of a flexible substrate, with an organic electronics-based image-sensor disposed on the opposing surface. The substrate is preferably a UV-curable polymer.

Figure 2:
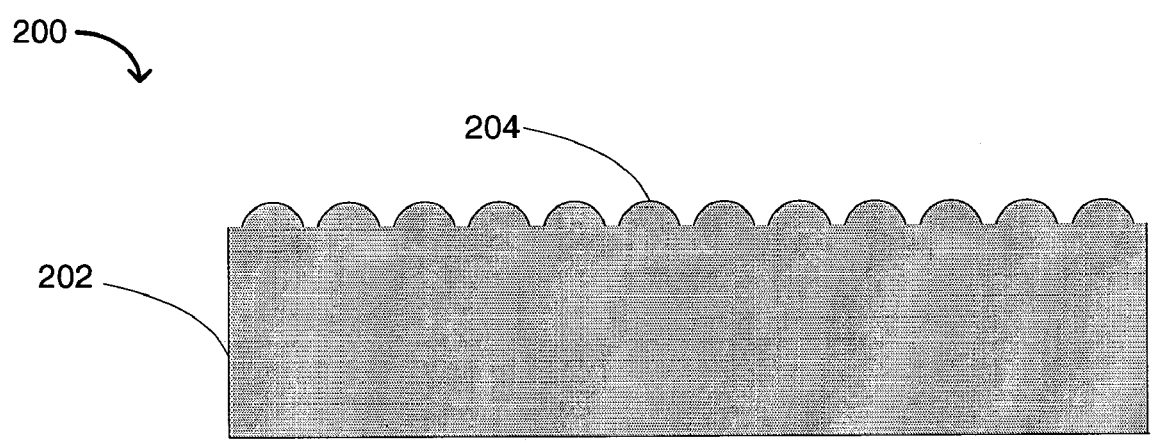
FIG. 2 is an illustration of a flexible lens array.

In one embodiment of a sensor, a transparent flexible polymer is used as the substrate, the polymer having optical properties that are determined by the particular design of the lenses and image-sensors. The substrate is preferably made of a material suitable for making the lenses, so that the lenses are etched directly out of the substrate material, without the need to place a separate layer that includes the lenses on top of the substrate. FIG. 2 is an illustration 200 of such a flexible lens array. Substrate 202 is made of a flexible optical polymer, such as the material used for lens array 102. Individual lenses 204 are shaped directly from the body of the substrate. Suitable flexible materials are known, and include various plastic polymers, such as polyimides. Since the rigid substrate of previous lens arrays has been replaced by a flexible substrate, the resulting lens array is flexible.

CMOS technology is commonly used for electronic image-sensing components of existing compound eye image sensors. CMOS processes use a high purity silicon substrate, but there can be problems in manufacturing a CMOS sensor on a flexible organic substrate. Silicon-on-isolator technology is another option that uses sapphire, glass, or silicon substrates. A recent version of silicon-on-isolator technology is the Separation by Implantation of Oxygen (SIMOX) process. Fabrication techniques for electronic circuits, including those using CMOS technology, generally involve processes such as diffusion, thermal oxidation, ion implantation, photolithography, etching, evaporation, sputtering, chemical vapor deposition (CVD or MOCVD) and high temperature (>1000° C.) film growth. These processes effectively prohibit the use of flexible organic substrates because they involve temperatures well above the melting point of typical flexible polymers. Moreover, there can be a significant mismatch between the coefficient of thermal expansion (CTE) of plastic polymers, with CTE 20-30 ppm/° C., and silicon, with CTE of 4.2 ppm/° C. This means that temperature variations can cause a polymer-based lens array to be misaligned with a silicon-based image-sensing array.

Figure 3:
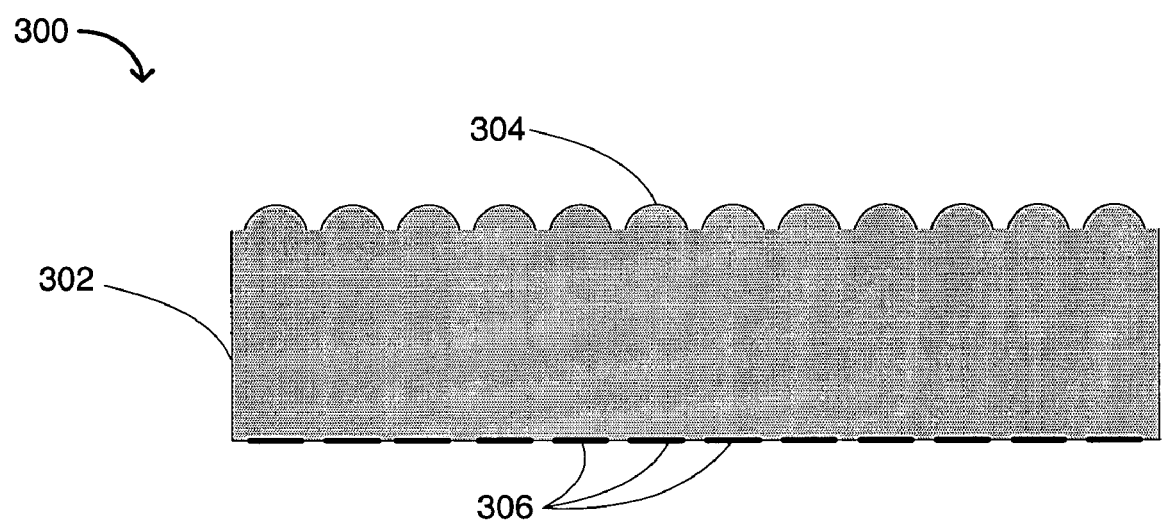
FIG. 3 is an illustration of a flexible compound eye image sensor

Embodiments of the sensors described here use electronic components made using organic materials (organic electronics) on a flexible substrate to fabricate the image-sensing component of a compound eye image sensor. FIG. 3 is an illustration 300 of a flexible image sensor, having lens array 304 formed directly from flexible substrate 302 on a first surface of the substrate, and an array of organic photodetectors 306 disposed on a second surface of the substrate. Organic electronics are used to make thin-film transistors (TFTs), photodetectors, and other components. For example, the TFT can be pentacene transistors with an 18-micron channel length. Other organic materials, such as poythiophenes or thiophene oligomers can be used. Each sensor has an effective sensing area of about 50×50 square microns.

Organic photodetectors that have been demonstrated on rigid substrates have sufficiently high photosensitivity, low dark current and large dynamic range to allow demonstrations of large area photodiode arrays and page size image scanners. When employed in one-dimensional linear photodiode arrays or in two-dimensional active matrices, the sensors can distinguish gray levels with at least 12-bit resolution, which is attractive for high quality imaging applications.

Devices based on organic electronics can be deposited onto a substrate by solution processing, a process that takes place at low temperatures, i.e., below about 120° C. This temperature is much lower than the temperature involved in non-organic electronic device fabrication. This means that the image sensor can be printed on almost any substrate, including substrates made from flexible organic polymers.

One benefit conferred by the above design, is that both the image sensor and the lens array are manufactured using similar, low temperature processes. A preferred manufacturing process for the photodetectors uses solution-printing techniques. Other processes that can be deployed as part of organic electronics fabrication are spin-coating, solution casting, and evaporation, all of which take place at low enough temperatures to accommodate a flexible polymeric substrate.

Since both the lens array and the image sensor circuits are fabricated using similar, organic processes, the same tool set can be deployed for both, conferring a manufacturing cost advantage. Furthermore, accurate alignment between the top and bottom surface is possible because the lens array and the image sensor are well suited to wafer level micro-optical fabrication and assembly technologies utilizing lithographic micron level alignment accuracy. Alignment accuracy of a few microns over a 4-inch wafer can be achieved. A double-sided mask aligner or similar equipment could be used. This level of alignment accuracy is harder to achieve when two separate processes are deployed to make the optics and the electronics because the different processes require different tool sets that need to be aligned with each other.

The lens array is preferably fabricated using a continuous roll type manufacturing process, in which the array is created on a roll of flexible polymeric substrate. The substrate rolls can be up to a few meters wide and 50 km long. In one manufacturing sequence, the image sensor is first printed onto the flexible substrate in a series of steps and the lens array deposition then completes the manufacturing process.

Figure 4:
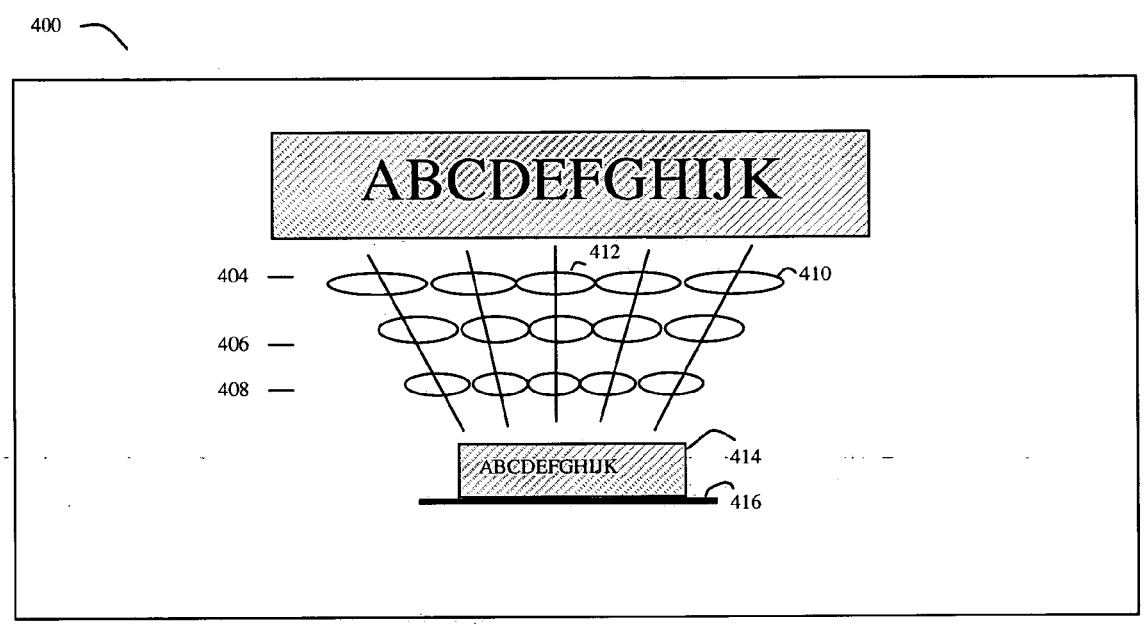
FIG. 4 is an illustration of a planar compound eye image sensor using a cluster design.

A benefit of a flexible compound eye image sensor is the ability to design sensors with curved image planes. This is advantageous because, unless corrected for, the planar sensor geometries associated with rigid substrate compound eye sensors will not maintain the image surface of each channel in the same plane, nor maintain the light flux independent of the field angle. Correction for these effects requires the use of elliptical anamorphic lenses with angle-dependent lens curvature and aperture. Such lenses greatly complicate optical design, and lead to system aberrations and resolution degradation. FIG. 4 is an illustration 400 of a planar compound eye image sensor that uses a cluster design having stacked arrays of lenses in order to correct for the distortions referred to above. Object 402 is imaged by three lens arrays 404, 406, 408 that comprise elliptical anamorphic lenses 410 that have angle-dependent optical properties. The lenses vary within each array, with lenses near the periphery, such as lens 410 being more elongated than a lens near the center of the array, such as lens 412. The corrected, undistorted image 414 is shown on a planar image surface 416.

Figure 5:
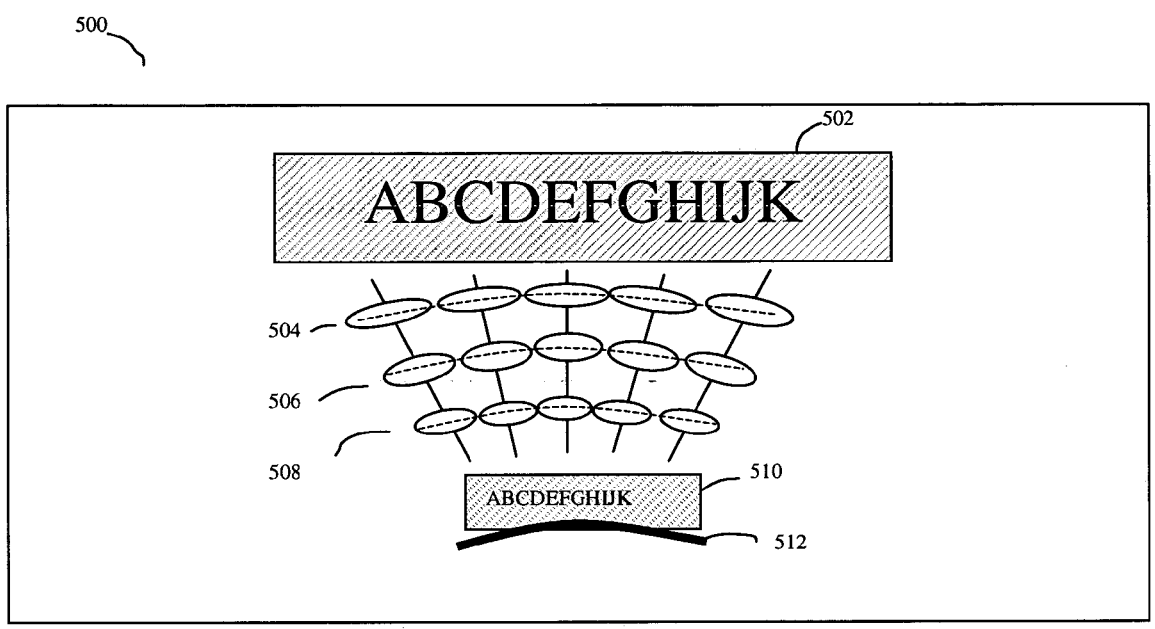
FIG. 5 is an illustration of a curved compound eye image sensor using a cluster design.

By contrast, in curved sensor geometry image sensor 500, illustrated in FIG. 5, the lenses within each array 504, 506, 508 each have the same shape, aperture, and focal length. Within an array, each lens receives the same light flux, and can therefore have the same aperture. The curved image sensor produces image 510 of object 502 on curved image surface 512.

Flexible compound eye image sensors have low resolution applications in products such as cameras, cell phones, security cameras, and ultra thin cameras. Flexible image sensors also have potential applications in the automotive industry as rear view sensors, and in applications for use as wide field of view sensors conformally mounted onto an airframe.

Other embodiments are within the scope of the following claims. For example, a flexible image sensor array is typically about 1-2 centimeters square or smaller, but can be as large as 6-10 centimeters square with a resolution of 36 to 250 dots per inch. The lenses are preferably arranged in a square grid at a 50 micron pitch, but the pitch could be as large as about 1 mm or as low as about 10 microns. A varying lens pitch and different x and y direction pitches can be used. The sensors can be used to detect visible light and near infrared. The field of view is wide, such as in the range of $\pi$ to $3\pi$ steradians. While certain benefits of described embodiments have been identified above, other embodiments may be within the scope of the claims and not have any or all of the identified benefits.

What is claimed:

1. An image sensor comprising:
a flexible substrate having a first side facing a first direction and a second side facing a second direction opposite to the first direction,
a plurality of lenses in a first array disposed on the first surface of the flexible substrate, and
a plurality of organic integrated circuit photodetectors in a second array on the second side of the substrate, wherein each lens in the first array is aligned with a photodetector in the second array.

2. The image sensor of claim 1, wherein the first array of lenses is formed by etching the substrate, such that the substrate and the lenses are made of the same material.

3. The image sensor of claim 1, wherein the substrate is a UV-curable polymer.

4. The image sensor of claim 1, wherein the first array of lenses is deposited by a continuous roll process.

5. The image sensor of claim 1, wherein the first array and the second array are aligned to an accuracy of at least three microns.

6. The image sensor of claim 1, wherein a first tool set is used to place the first array onto the substrate and a second tool set is used to place the second array on the substrate.

7. The image sensor of claim 6, wherein the first tool set and second tool set are the same.

8. The image sensor of claim 1, wherein the second array is deposited on the second side of the substrate by a wafer level organic integrated circuit technology.

9. The image sensor of claim 1, wherein the second array is placed on the substrate by a process that operates at a temperature of less than about 120 degrees centigrade.

10. The image sensor of claim 1, wherein the second array is placed on the substrate by a solution printing technique.

11. The image sensor of claim 1, wherein the substrate is planar.

12. The image sensor of claim 1, wherein the substrate is curved.

13. The image sensor of claim 12, wherein at least one of the lens pitch and lens focal length is customized to a geometry of the substrate.

14. The image sensor of claim 1, wherein the substrate surface is ellipsoidal.

15. The image sensor of claim 1, wherein at least one of a lens pitch and a lens focal length varies within the first lens array.

16. The image sensor of claim 1, wherein the first array and the second array are one-dimensional arrays.

17. The image sensor of claim 1, wherein the first array and the second array are two-dimensional arrays.

18. The image sensor of claim 1 further comprising at least one intermediate array of lenses disposed between the first array of lenses and the second array of photodetectors.

19. The image sensor of claim 18, wherein each lens in each of the at least one intermediate array of lenses has an optical correspondence with a lens in the first array of lenses.

20. The image sensor of claim 18, wherein each lens of the at least one intermediate arrays has an optical correspondence with a photodetector in the second array.

21. A method of fabricating an image sensor comprising:
depositing an array of photodetectors on a first surface of a flexible substrate, the first surface facing a first direction, the photodetectors being deposited using wafer level organic integrated circuit technology; and
forming an array of lenses on a second surface of the substrate, the second surface facing a second direction opposite to the first direction.

22. The method of claim 21, wherein the lens array is deposited using a continuous roll type manufacturing process.

23. The method of claim 21, wherein the photodetectors are deposited using a solution printing process.

* * * * *